(12) United States Patent
Tu et al.

(10) Patent No.: US 6,208,559 B1
(45) Date of Patent: Mar. 27, 2001

(54) METHOD OF OPERATING EEPROM MEMORY CELLS HAVING TRANSISTORS WITH THIN GATE OXIDE AND REDUCED DISTURB

(75) Inventors: Robert H. Tu, Sunnyvale; Sunil D. Mehta, San Jose, both of CA (US)

(73) Assignee: Lattice Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 09/441,220

(22) Filed: Nov. 15, 1999

(51) Int. Cl.$^7$ .................................................. G11C 16/04
(52) U.S. Cl. .............................. 365/185.18; 365/185.02; 365/185.29
(58) Field of Search ..................... 385/185.18, 185.29, 385/185.02

(56) References Cited

U.S. PATENT DOCUMENTS

| | | | |
|---|---|---|---|
| 4,924,278 | 5/1990 | Logie | 357/23.5 |
| 5,479,367 | 12/1995 | Maurelli et al. | 365/182 |
| 5,494,838 | 2/1996 | Chang et al. | 437/43 |
| 5,517,470 | 5/1996 | Zanders et al. | 365/185.28 |
| 5,579,261 | 11/1996 | Radjy et al. | 365/185.33 |
| 5,648,289 | 7/1997 | Park | 437/48 |
| 5,652,447 | 7/1997 | Chen et al. | 257/315 |
| 5,666,309 | 9/1997 | Peng et al. | 365/185.08 |
| 5,680,346 | 10/1997 | Pathak et al. | 365/185.1 |
| 5,742,542 | 4/1998 | Lin et al. | 365/185.08 |
| 5,761,116 | 6/1998 | Li et al. | 365/185.1 |
| 6,009,033 | * 12/1999 | Li et al. | 365/185.19 X |

OTHER PUBLICATIONS

Nonvolatile Semiconductor Memory Technology, A Comprehensive Guide to Understanding and Using NVSM Devices, Edited by William D. Brown, Joe E. Brewer, IEEE Press, 1988, pp. 36–39, 103, 627–641, 720–728.
Semiconductor Memories, A Handbook of Design, Manufacture, and Application, Second Edition, Betty Prince, Wiley Publishers, 1991, pp. 194–200.

* cited by examiner

Primary Examiner—Huan Hoang
(74) Attorney, Agent, or Firm—Brinks Hofer Gilson & Lione

(57) ABSTRACT

An improved process of programming and erasing an EEPROM memory cell in an array of identical cells uses a reduced voltage on the write transistor of the cell to be programmed or erased and at the same time applies smaller voltages across the relatively thin oxides of the write transistors of the other cells in the array so as to reduce oxide leakage and damage in those cells but without disturbing the information stored in those cells. The result is the ability to scale down the size of the EEPROM memory cell allowing enhanced economies and permitting faster program, erase and reading speeds.

29 Claims, 2 Drawing Sheets

METHOD OF OPERATING EEPROM MEMORY CELLS HAVING TRANSISTORS WITH THIN GATE OXIDE AND REDUCED DISTURB

BACKGROUND OF THE INVENTION

The present invention relates generally to electrically erasable and programmable read-only memory (EEPROM) devices and more particularly to an improved EEPROM cell and its method of use having smaller layout size, lower program/erase voltage requirements and higher read, erase and programming speeds and better endurance than conventional EEPROMS.

The semiconductor community faces increasingly difficult challenges as it moves into production of semiconductor devices at feature sizes approaching 0.1 micron. Cell designs for typical semiconductor devices must be made more durable, smaller (i.e., scalable), cost effective to manufacture, faster in reading and capable of operating at lower voltages and power to enable manufacturers to compete in the semiconductor industry.

One of the more recent generation of memories facing those challenges, EEPROMS allow their program contents to be electrically programmed bit-by-bit and electrically erased. Conventional erasable programmable read-only memories (EPROMS), by way of contrast, are generally erased in bulk and by the frequently inconvenient technique of exposure to ultraviolet light. EEPROM cells have been recently extensively used in programmable logic devices (PLD's).

Most conventional EEPROM cells are formed of three transistors: a write transistor, a read transistor and a sense transistor. The EEPROM cell is programmed and erased by removing electrons from, or adding electrons to, a floating gate of one of the transistors. In conventional EEPROM cells the read transistor and the sense transistor are connected to the same data (bitline). As a result, when the read transistor is turned on, the sense transistor is effectively used as the storage cell of the EEPROM.

FIG. 1 shows an array of four identical conventional EEPROM memory cell structures designated A, B, C and D which form a portion of a larger array composed of identical memory cell structures. The voltage lines to the other cells in the larger array not depicted in the figure have the symbol "!" as a prefix, just as is the case for cells B, C and D, unless those lines to the other cells are the same lines as are attached to cell A. The EEPROM memory cell A consists of a write transistor 12a, a read transistor 14, a sense transistor 16, a control gate capacitor C and a tunnel diode TD. Each of the three transistors has drain and source regions marked D and S, respectively. The operation of the conventional EEPROM memory cell A is summarized in Table 1 below.

When programming the memory cell A, an intermediate pumped programming voltage $V_{pp}$ (typically about 11–12 V) is applied to the bitline WBL of the write transistor 12a and a relatively high voltage $V_{pp}+V_t$ (typically between 13–15 V) is applied to its wordline WL in order to pass $V_{pp}$ through the tunnel diode TD to the sense transistor 16. Under this bias condition, a voltage drop is present between $V_d$ and the floating gate FG. Due to the drop, electrons tunnel from the floating gate to $V_d$, thereby reducing or eliminating the negative charge on the floating gate of the sense transistor 16 and thus turning on the sense transistor.

When erasing the memory cell A, the relatively high voltage $V_{pp}+V_t$ is applied to the capacitor C from array control gate line ACG. Under this bias condition, a voltage drop is present between the floating gate FG and $V_d$. As a result, electrons tunnel from $V_d$ to floating gate FG, thereby negatively charging FG and turning off the sense transistor 16.

When reading the contents of the memory cell A, zero volts is applied to the bitline of the write transistor 12a. A voltage, $V_{cc}$ of about 1.8 V, is applied to the wordline WL and a voltage $V_{pt}$ of about 0.6–1.4 V is applied to the drain of the read transistor 14.

For each operation (read, program, erase), the substrate of the cell (not shown) is held at ground potential. The high voltage $V_{pp}+V_t$ can be generated through an additional circuit (not shown). However, the higher the voltage $V_{pp}+V_t$ needed, the more complex the semiconductor process and circuitry required.

While programming the memory cell A, voltages are applied to the write transistors 12b, 12c of memory cells B and C. In some cases the same voltages as are applied in cell A are applied to nodes in cells B and C corresponding to nodes in cell A because the voltage lines are shared. In other cases different voltages are applied. For example, bit line WBL applies a voltage $V_{pp}$ to the drain of cell B's write transistor 12b while word line !WL applies a zero voltage to the gate of that write transistor. As a result, the write transistor of memory cell B experiences a voltage of $V_{pp}$ over the oxide of that transistor. The large size of $V_{pp}$, about 11 V, requires that that oxide be thick, about 150 Å, to prevent gate leakage by tunneling across the oxide which could damage the oxide. Similarly, in memory cell C, word line WL applies a high voltage of $V_{pp}+V_t$ to the gate of that cell's write transistor 12c while bit line !WBL applies a voltage of zero to the drain of that write transistor, producing a voltage of $V_{pp}+V_t$ across the oxide of that write transistor. As was true of the write transistor 12b in cell B, the large size of $V_{pp}+V_t$, about 12–14 V, also requires that the oxide of the write transistor 12c in cell C be thick. A thick oxide, as is well known in the art, renders difficult the scaling down of the transistor of which it is a component, in this case the write transistor.

TABLE 1

|  | WBL | ACG | WL | PT | PTG | WLR | SUBSTRATE |
|---|---|---|---|---|---|---|---|
| Program | $V_{pp}$ | 0 | $V_{pp} + V_t$ | HiZ | 0 | $V_{cc}$ | 0 |
| Erase | 0 | $V_{pp} + V_t$ | $V_{cc}$ | HiZ | $V_{pp}$ | $V_{cc}$ | 0 |
| !Program (row) | $V_{pp}$ | 0 | 0 | HiZ | 0 | 0 | 0 |
| !Program (col) | 0 | [?0][$V_{pp} + V_t$?] | 0 | HiZ | 0 | 0 | 0 |
| Read | 0 | 0 | $V_{cc}$ | $V_{pt}$ | 0 | $V_{cc}$ | 0 |

The non-scalability of the write transistors prevents the scaling down of the entire EEPROM memory cell. The inability to scale down the memory cell size is undesirable because the trend in the electronics industry is to have smaller and smaller memory cells to enable an array of the same physical size to store larger and larger amounts of data.

Another drawback associated with the conventional EEPROM structure is that the thick oxide slows down the speed with which the EEPROM cell can be programmed, erased and read. This problem conflicts with the industry trend of manufacturing faster PLDs.

Thus, there is a need to provide an EEPROM memory cell structure and operating method which provide scalability and faster operating speeds while at the same time using smaller program/erase voltages, thereby increasing the endurance of the EEPROM memory cell.

BRIEF SUMMARY OF THE INVENTION

By way of introduction only, an improved process of programming and erasing an EEPROM memory cell in an array of identical cells uses a reduced voltage on the write transistor of the cell to be programmed or erased and at the same time applies smaller voltages across the relatively thin oxides of the write transistors of the other cells in the array so as to reduce oxide leakage and damage in those cells but without disturbing the information stored in those cells.

An advantage of the present invention is the ability to scale down the size of the EEPROM memory cell.

Another advantage of the present invention is that it requires smaller voltages to program and erase the memory cell.

A feature of the present invention is that because of the smaller gate oxide thicknesses, the overall transistor size can be reduced, thus allowing for faster program, erase and reading speeds.

Another advantage of the present invention is that the gate leakage and damage to the oxide, usually resulting from smaller gate oxide thickness, is avoided.

Another advantage of the present invention is that the source of the write transistor is at a higher voltage, allowing faster programming time.

These and other advantages and features of the present invention will become apparent from the description of the embodiments below.

DETAILED DESCRIPTION OF THE EMBODIMENTS

Figure 1:
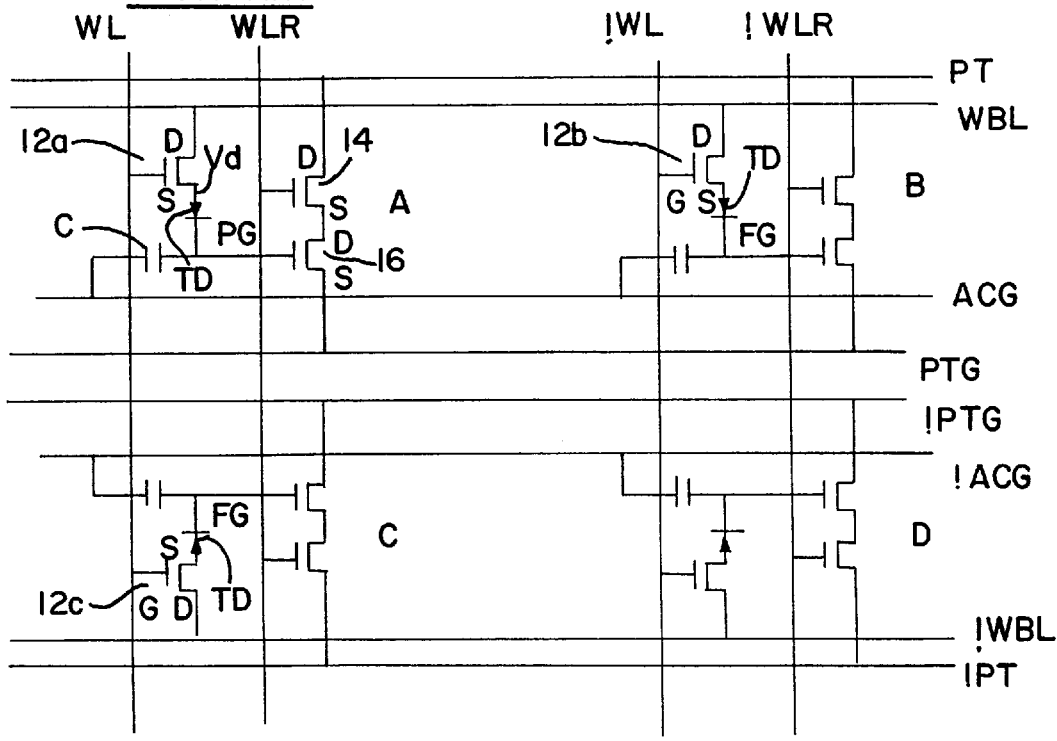
FIG. 1 is a schematic diagram of a portion of an array of conventional EEPROM memory cells.
Figure 2:
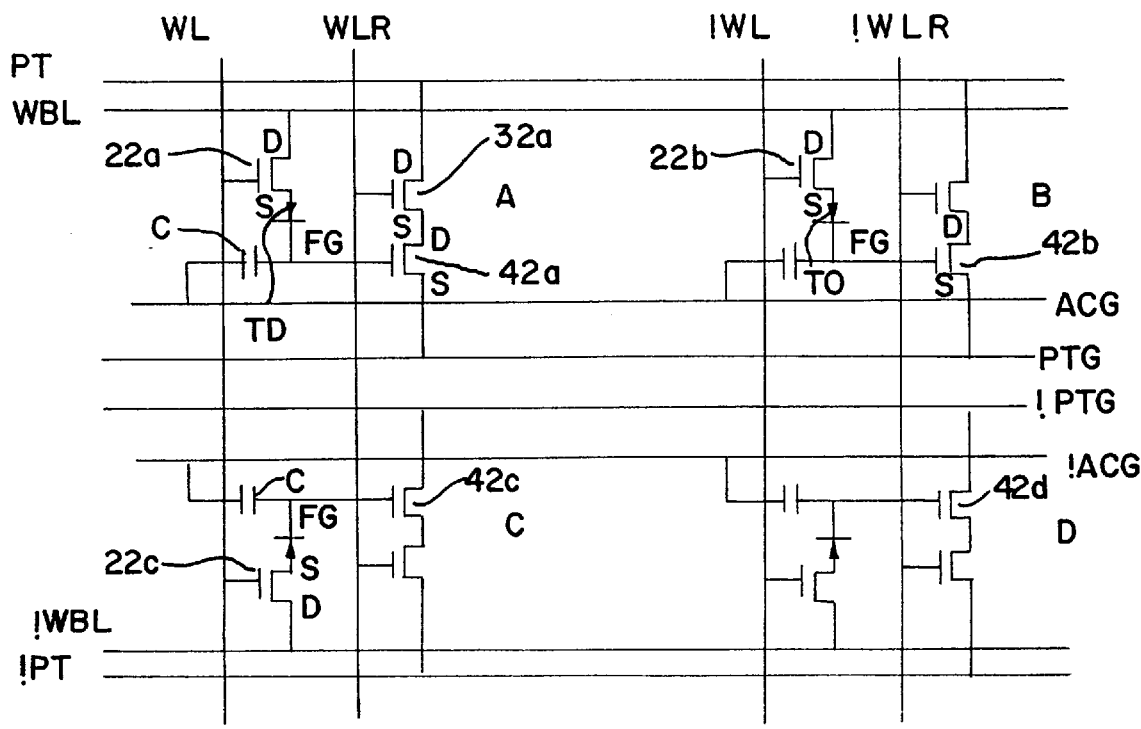
FIG. 2 is a schematic diagram showing a portion of an array of the EEPROM memory cells according to the present invention.

FIG. 2 illustrates a schematic diagram of an array of four identical enhanced EEPROM memory cell structures according to the present invention and designated A, B, C and D which form a portion of a larger array composed of identical memory cell structures. The voltage lines to the other cells in the larger array not depicted in the figure have the symbol "!" as a prefix, just as is the case for cells B, C and D, unless those lines to the other cells are the same lines as are attached to cell A. As shown in FIG. 2, the EEPROM memory cell A of the present invention incorporates a depletion type write transistor 22a, an enhancement mode read transistor 32, a partial depletion type sense transistor 42a with a threshold voltage of about zero, a control gate capacitor C and a tunnel diode TD. The gate capacitor couples the ACG voltage to the sense transistor 42a, thereby affecting the voltage on the floating gate, FG. The cell of the present invention has different programming and erase voltage values than that of the conventional EEPROM memory cell depicted in FIG. 1.

Figure 3:
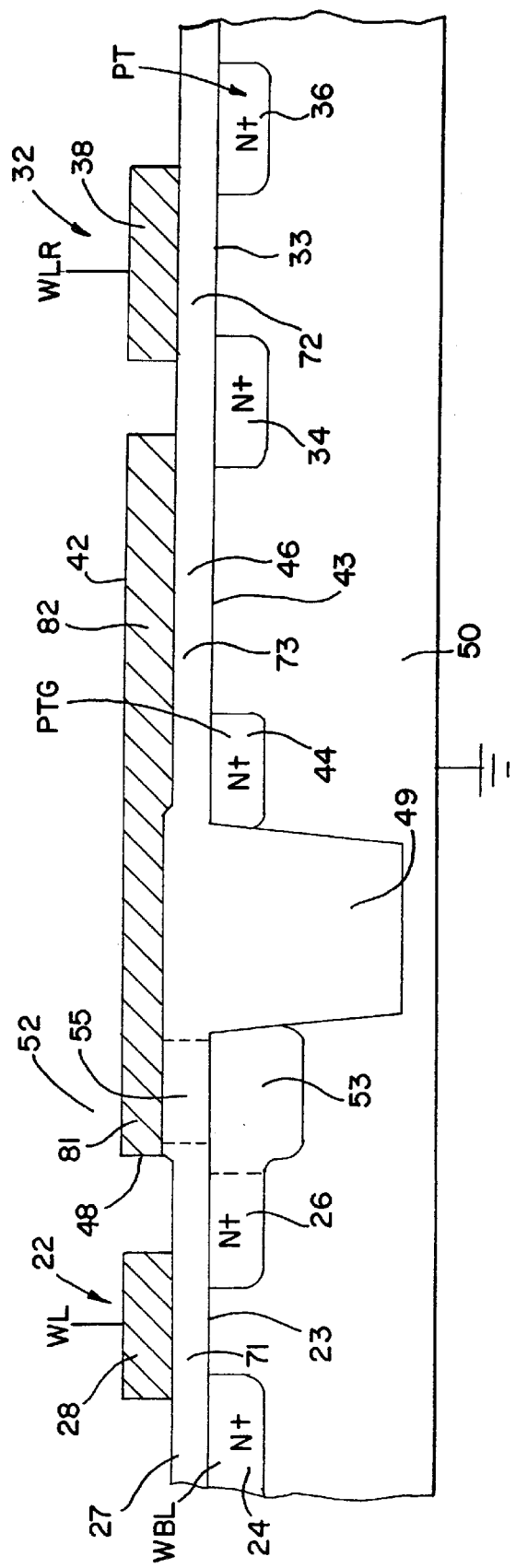
FIG. 3 is a composite of cross sectional views of an EEPROM memory cell structure according to the present invention.

FIG. 3 shows a cross sectional side view of one of the four identical EEPROM structures depicted in FIG. 2. (As more fully described below, FIG. 3 actually shows a composite of two cross-sectional side views.) In FIG. 3, a P-type semiconductor substrate 50 has 5 N+ type regions formed on and below its surface by standard diffusion techniques. These 5 N+ type regions correspond to the source and drain regions of the three transistors which make up the EEPROM memory cell depicted in FIG. 2.

A depletion type write transistor 22 comprises a drain 24, a source 26, a channel region 23 between the drain 24 and the source 26, a gate oxide 71 forming a portion of oxide layer 27 having a thickness of about 90 Å and a gate 28 formed on top of gate oxide 71. Bitline WBL is connected to the drain 24, while a first wordline WL is connected to the gate 28 of the transistor.

Tunnel diode 52 has as a first terminal a program junction N+ region 53 and as a second terminal 81 a portion of a polysilicon layer 48. The program junction region is an extension of source 26 of the write transistor but descends deeper into the substrate 50 to an extent variable with different embodiments as is appreciated by those skilled in the art. A portion of the oxide layer 27 over the program junction 53 serves as a tunnel diode oxide layer 55.

Enhancement mode read transistor 32 comprises a drain 36, a source 34, and a channel region 33 between the drain 36 and source 34. A gate oxide 72 forming a portion of the oxide layer 27 extends over the channel region 33. Formed on top of the gate oxide 72 is a gate 38. The gate is coupled to a second wordline WLR while the drain of the read transistor 36 is coupled to a product term line PT.

The partial depletion type sense transistor 42 comprises a source 44, a drain 34 (which is also the source 34 of the read sense transistor 32), and a channel region 43 between the drain 34 and a source 44. A gate oxide 73, forming a portion of the oxide layer 27, extends over channel region 33, source 44 and drain 34 and serves in one of the alternative embodiments of the present invention described below as a tunnel region 46. The polysilicon layer 48 extends into the sense transistor 42 and overlies the source 44. The floating gate 82 is a region of the polysilicon layer 48 and overlies channel region 43 so that when sufficient voltage is present on the floating gate 82, the channel 43 will conduct current between the source 34 and the drain 44 of the depletion type sense transistor 42.

Field oxide layer 49, a shallow trench isolation, insulates the floating gate 82 from the underlying substrate 50 and separates the sense transistor 42 and the write transistor 22. The thickness of the field oxide layer 49 is approximately 4000 Å.

In one alternative embodiment of the present invention, the oxide layer has a thickness greater than the order of 90 Å, while in another alternative embodiment of the present invention, the oxide layer has a thickness less than the order of 90 Å.

As mentioned above, FIG. 3 for clarity actually shows a composite of two cross-sectional views. One of ordinary skill in the art will appreciate that the three transistors and the tunnel diode depicted in FIG. 3. may not lie in a single plane. One of that skill will appreciate that according to the embodiments of the present invention described herein, the write transistor 22, the tunnel diode 52, a portion of the polysilicon layer 48, and a portion of the field oxide layer 49 lie in a first plane and that a more accurate depiction would show that plane in a single cross-section. By contrast, one of ordinary skill in the art will also appreciate that the sense transistor 42, the read transistor 32, a portion of the polysilicon layer 48, and a portion of the field oxide layer 49 lie in another plane generally disposed parallel to and above the first plane and that a more accurate depiction would show that other plane in a second cross-section. The portions of the polysilicon layer 48 and of the field oxide layer 49 in both planes are connected by a polysilicon layer and a field oxide layer not depicted.

Operation of the array of four identical EEPROM memory cells of the present invention will now be described with reference to Table 2 below and FIGS. 2 and 3.

in the prior art noted above. Further, because the voltage at the drain of the transistor 22b is Vpp while the voltage on the gate of transistor 22b is $V_{pp}-V_{max}$, the voltage at the second terminal of the tunnel diode TD in memory cell B is limited to about $V_{pp}-V_{max}$, i.e., about 2 V. However, the second terminal of the tunnel diode is coupled directly to the floating gate of sense transistor 42b. This small a voltage on that floating gate, when compared to the zero voltage applied to the source of that sense transistor by line PTG, is insufficient to place charge on that floating gate. As a result, no disturb problem arises.

Similarly, in memory cell C, word line WL applies a high voltage of $V_{pp}$ to the gate of that cell's write transistor 22c while bit line !WBL applies a voltage of $V_{pp}-V_{max}$ to the drain of that write transistor, producing a voltage of $V_{max}$ across the gate oxide of that write transistor. At that voltage there will be minimal leakage by tunneling across the oxide, thus similarly avoiding the risk of damage in the prior art noted above. Further, the voltage at the floating gate of the sense transistor in cell C is limited to $V_{pp}-V_{max}$ or about 2 V because line !ACG supplies $V_{pp}-V_{max}$ to the capacitor and $V_{pp}-V_{max}$ is applied to the drain of the write transistor

TABLE 2

|  | WBL | ACG | WL | PT | PTG | WLR | SUB-STRATE |
|---|---|---|---|---|---|---|---|
| Program | $V_{pp}$ | 0 | $V_{pp}$ | HiZ | 0 | $V_{cc}$ | 0 |
| Erase | 0 | $V_{pp}$ or $V_{pp} + V_t$ | $V_{cc}$ | HiZ | $V_{pp}$ or $V_{pp} + V_t$ | $V_{cc}$ | 0 |
| !Program (row) | $V_{pp}$ | 0 | $V_{pp} - V_{max}$ | HiZ | 0 | $V_{cc}$ | 0 |
| !Program (col) | $V_{pp} - V_{max}$ | $V_{pp} - V_{max}$ | $V_{pp}$ | HiZ | HiZ | $V_{cc}$ | 0 |
| Read | 0 | 0 | $V_{cc}$ | $V_{pt}$ | 0 | $V_{cc}$ | 0 |

The three operations of the EEPROM memory cell are read, program, and erase. The various voltages applied to the circuit depicted in FIG. 2 are presented in Table 2.

When programming the memory cell A of the present invention, $V_{pp}$ (about 11–12 V) is supplied on both the bitline WBL of the write transistor 22a and the wordline WL coupled to write transistor 22a. The lower voltage level can be used on the WL because the write transistor 22a is a depletion type transistor. The product term voltage PT provided on the bitline of the read transistor 32 is left floating, i.e., is at HiZ. The wordline WLR supplied to the gate of the read transistor 32 is $V_{cc}$, about 1.8 V. The PTG line to the source of the sense transistor 42a, and the substrate 50 are all tied to ground.

While programming the memory cell A, voltages are applied to the write transistors of memory cells B and C. In some cases the same voltages as are applied in cell A are applied to nodes in cells B and C corresponding to nodes in cell A because the voltage lines are shared. In other cases different voltages are applied. For example, bit line WBL applies a voltage $V_{pp}$ to the drain of cell B's write transistor 22b while word line !WL applies a voltage $V_{pp}-V_{max}$ to the gate of that write transistor where $V_{max}$ is the maximum voltage allowable over the 90 Å thick oxide of that transistor without causing large leakage or oxide damage. In the present embodiment $V_{max}$ is numerically about 10 V. As a result, the write transistor of memory cell B experiences a voltage of $V_{max}$ over the 90 Å thick gate oxide of that transistor. At this voltage level no gate leakage by tunneling across the oxide will occur, thus avoiding the risk of damage in that cell. This small a voltage applied to the floating gate of that sense transistor is insufficient to place charge on that gate. As a result, no disturb problem arises.

Another feature of the present embodiment is the more efficient passthrough of the write transistor's (22a) drain voltage to that transistor's source during programming. Because the write transistor is a depletion type, its threshold voltage $V_{th}=-|V_{th}|$. Because during programming the write transistor is on, its gate source voltage $V_{gs}$ must equal or exceed $V_{th}$. As a result, $V_s \leq V_g+|V_{th}|$ or $V_s \leq V_{pp}+|V_{th}|$.

Erasing the EEPROM memory cell A of the present invention is provided by supplying a zero voltage to the bitline WBL of that cell's write transistor 22a; supplying a voltage $V_{cc}$ to the wordline WL of the write transistor and to the wordline WLR of that cell's enhancement mode read transistor 32; and providing $V_{pp}$, or alternatively $V_{pp}+V_t$, to ACG, where $V_t$ is about 0.5–2 V. The product term PT coupled to the drain of the read transistor, floats at HiZ while PTG is supplied with $V_{pp}$ or $V_{pp}+V_t$. The substrate 50 is held at ground potential.

When reading information stored in the EEPROM memory cell A of the present invention, zero volts is applied to the bitline WBL of that cell's write transistor 22a. $V_{cc}$ is applied to the wordline WLR of that cell's read transistor 32 and voltage $V_{pt}$ of about 0.5–2 V is applied to the drain of the read transistor 32 over line PT. The substrate 50 and line PTG to the source of that cell's sense transistor are held at ground potential. A zero voltage is supplied to line ACG. Under this bias condition, current flows between the drain of the read transistor and the source of the sense transistor 42a if the depletion type sense transistor is on, indicating a logic 1. If the depletion type sense transistor is off, current does not flow, indicating a logic 0.

In one alternative embodiment of the present invention, the sense transistors 42a, b, c and d of all the memory cells may be enhancement mode transistors. With an enhancement mode transistor acting as the sense transistor of memory cell A, $V_{cc}$ would be applied to ACG during the read operation In an alternative embodiment of the present invention, erasing of memory cell A can be performed in a different fashion. This operation of memory cell A will now be described with reference to Table 3. This technique of erasing is provided by supplying the voltage $V_{pp}$ to the bitline WBL and to the wordline WL of that cell's write transistor 22a; supplying the voltage $V_{cc}$ to the wordline WLR of that cell's read transistor 32; and providing $V_{pp}$ to ACG. The product term PT coupled to the drain of the read transistor, PTG and the substrate 50 are held at ground potential Under this bias condition, electrons tunnel through the gate oxide of that cell's depletion type sense transistor 42a from that transistor's channel region 43 to that transistor's floating gate.

TABLE 3

|  | WBL | ACG | WL | PT | PTG | WLR | SUB-STRATE |
|---|---|---|---|---|---|---|---|
| Program | $V_{pp}$ | 0 | $V_{pp}$ | HiZ | 0 | $V_{cc}$ | 0 |
| Erase | $V_{pp}$ | $V_{pp}$ | $V_{pp}$ | 0 | 0 | $V_{cc}$ | 0 |
| !Program (row) | $V_{pp}$ | 0 | $V_{pp} - V_{max}$ | HiZ | 0 | $V_{cc}$ | 0 |
| !Program (col) | $V_{pp} - V_{max}$ | $V_{pp} - V_{max}$ | $V_{pp}$ | HiZ | HiZ | $V_{cc}$ | 0 |
| Read | 0 | 0 | $V_{cc}$ | $V_{pt}$ | 0 | $V_{cc}$ | 0 |

The embodiments and operation described are manufactured and operated using well known techniques, and their method of manufacture and operation would be obvious to those skilled in the art. The foregoing description of the embodiments has been presented for purposes of illustration and description. It is not intended to be exhaustive or to limit the invention to the precise form disclosed, and obviously, modification and variation of the invention are possible in light of the above teaching. It is therefore intended in the appended claims to cover all such variations and modifications which fall within the true spirit and scope of the invention.

What is claimed is:

1. A process of operating a first memory cell in a memory array, the memory array including the first memory cell and a second memory cell in the same row of the memory array as the first memory cell, each of the memory cells in the array having a write transistor comprising a write gate, a write source, a write drain, and a write gate oxide, each of the memory cells having a sense transistor comprising a sense floating gate and a sense gate oxide, and each of the memory cells having a tunnel diode coupled at its first terminal to the write source and at its second terminal to the sense floating gate, the write transistors in the first memory cell and the second memory cell being coupled at their write drains, the process of operating the first memory cell comprising the acts of:

applying a voltage $V_{pp}$ to the first memory cell write gate and to the first memory cell write drain;

programming the first memory cell by removing electrons from the first memory cell's sense floating gate in response to the voltage $V_{pp}$;

generating a voltage $V_{pp}-V_{max}$ where $V_{max}$ is a voltage less than or equal to the maximum voltage which can be applied across the second memory cell write gate oxide without causing damage to the second memory cell write gate oxide or causing substantial leakage through the second memory cell write gate oxide;

applying the voltage $V_{pp}-V_{max}$ to the second memory cell write gate and, in response to the voltage $V_{pp}$ applied to the first memory cell write transistor, applying the voltage $V_{pp}$ to the second memory cell write drain;

generating across the second memory cell write gate oxide a voltage less than or equal to $V_{max}$ in response to said applying the voltage $V_{pp}-V_{max}$; and generating a voltage less than the voltage $V_{pp}-V_{max}$ at the second terminal of the second memory cell tunnel diode in response to the voltages $V_{pp}$ and $V_{pp}-V_{max}$ applied to the second memory cell write transistor, the voltage generated being insufficient to program or erase the second memory cell sense transistor.

2. The process according to claim 1, the memory array further including a third memory cell in the same column of the memory array as the first memory cell, the write transistors in the first memory cell and the third memory cell being coupled at their write gates, the process further comprising the acts of:

applying the voltage $V_{pp}-V_{max}$ to the third memory cell write drain and, in response to the voltage applied to the first memory cell write gate, applying the voltage $V_{pp}$ to the third memory cell write gate;

generating across the third memory cell write gate oxide a voltage less than or equal to $V_{max}$; and generating a voltage less than the voltage $V_{pp}-V_{max}$ at the second terminal of the third memory cell tunnel diode in response to the voltages $V_{pp}-V_{max}$ and $V_{pp}$ applied to the third memory cell write transistor, the voltage generated being insufficient to program or erase the third memory cell sense transistor.

3. The process according to claim 2, wherein $V_{max}$ is also less than or equal to the maximum voltage which can be applied across the third memory cell write gate oxide without causing damage to the third memory cell write gate oxide or causing substantial leakage through the third memory cell write gate oxide.

4. The process according to claim 3, wherein the first memory cell write transistor is a depletion type transistor.

5. The process according to claim 4, wherein the first memory cell sense transistor is a partial depletion type transistor.

6. The process according to claim 5, wherein the write gate oxide has a thickness less than or equal to about 90 Å.

7. The process according to claim 6, wherein the maximum voltage which can be applied across the second memory cell write gate oxide without causing damage or substantial leakage is about 10 V.

8. The process according to claim 5 wherein the write gate oxide has a thickness greater than or equal to about 90 Å.

9. The process according to claim 8, wherein the maximum voltage which can be applied across the second memory cell write gate oxide without causing damage or substantial leakage is about 10 V.

10. The process according to claim 5, further comprising the prior act of erasing the first memory cell by adding electrons to the first memory cell's sense floating gate by tunneling across the first memory cell's sense gate oxide.

11. The process according to claim 10, wherein the write gate oxide has a thickness less than or equal to about 90 Å.

12. The process according to claim 11, wherein the maximum voltage which can be applied across the second memory cell write gate oxide without causing damage or substantial leakage is about 10 V.

13. The process according to claim 10, wherein the write gate oxide has a thickness greater than or equal to about 90 Å.

14. The process according to claim 12, wherein the maximum voltage which can be applied across the second memory cell write gate oxide without causing damage or substantial leakage is about 10 V.

15. The process according to claim 5, further comprising the subsequent act of erasing the first memory cell by adding electrons to the first memory cell's sense floating gate by tunneling across the first memory cell's sense gate oxide.

16. The process according to claim 15, wherein the write gate oxide has a thickness greater than or equal to about 90 Å.

17. The process according to claim 16, wherein the maximum voltage which can be applied across the second memory cell write gate oxide without causing damage or substantial leakage is about 10 V.

18. The process according to claim 16, wherein the maximum voltage which can be applied across the second memory cell write gate oxide without causing damage or substantial leakage is about 10 V.

19. The process according to claim 15, wherein the write gate oxide has a thickness less than or equal to about 90 Å.

20. The process according to claim 5, further comprising the prior act of erasing the first memory cell by adding electrons to the first memory cell's sense floating gate by tunneling through the tunnel diode.

21. The process according to claim 20, wherein the write gate oxide has a thickness less than or equal to about 90 Å.

22. The process according to claim 21, wherein the maximum voltage which can be applied across the second memory cell write gate oxide without causing damage or substantial leakage is about 10 V.

23. The process according to claim 20, wherein the write gate oxide has a thickness greater than or equal to about 90 Å.

24. The process according to claim 22, wherein the maximum voltage which can be applied across the second memory cell write gate oxide without causing damage or substantial leakage is about 10 V.

25. The process according to claim 5, further comprising the subsequent act of erasing the first memory cell by adding electrons to the first memory cell's sense floating gate by tunneling through the tunnel diode.

26. The process according to claim 25, wherein the write gate oxide has a thickness less than or equal to about 90 Å.

27. The process according to claim 26, wherein the maximum voltage which can be applied across the second memory cell write gate oxide without causing damage or substantial leakage is about 10 V.

28. The process according to claim 25, wherein the write gate oxide has a thickness greater than or equal to about 90 Å.

29. The process according to claim 27, wherein the maximum voltage which can be applied across the second memory cell write gate oxide without causing damage or substantial leakage is about 10 V.

* * * * *

UNITED STATES PATENT AND TRADEMARK OFFICE
CERTIFICATE OF CORRECTION

PATENT NO. : 6,208,559 B1
DATED : March 27, 2001
INVENTOR(S) : Robert H. Tu And Sunil D. Mehta It is certified that error appears in the above-identified patent and that said Letters Patent is hereby corrected as shown below:

Column 9, claim 14,
Line 20, change "12" to -- 13 --.

Column 9, claim 18,
Lines 35-38, must be changed to claim -- 19 --.

Column 10, claim 19,
Lines 1-2, must be changed to claim -- 18 --.

New claim 19,
Change "16" to -- 18 --.

Column 10, claim 24,
Line 16, change "22" to -- 23 --.

Column 10, claim 29,
Line 33, change "27" to -- 28 --.

Signed and Sealed this

Twentieth Day of November, 2001

*Attest:*

*Attesting Officer*

NICHOLAS P. GODICI
*Acting Director of the United States Patent and Trademark Office*